United States Patent
Kravljaca et al.

(10) Patent No.: US 10,634,735 B2
(45) Date of Patent: Apr. 28, 2020

(54) CIRCUITS AND METHODS FOR REGULATOR DIAGNOSTICS

(71) Applicant: Allegro MicroSystems, LLC, Manchester, NH (US)

(72) Inventors: Vladimir Kravljaca, Manchester, NH (US); Virag V. Chaware, Nashua, NH (US); Jesse Lapomardo, Pembroke, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 65 days.

(21) Appl. No.: 15/830,107

(22) Filed: Dec. 4, 2017

(65) Prior Publication Data

US 2019/0170832 A1 Jun. 6, 2019

(51) Int. Cl.
| | |
|---|---|
| *G01R 33/00* | (2006.01) |
| *G05F 1/595* | (2006.01) |
| *G05F 1/575* | (2006.01) |
| *G01R 33/07* | (2006.01) |
| *G05F 1/569* | (2006.01) |
| *G05F 3/26* | (2006.01) |

(52) U.S. Cl.
CPC ....... *G01R 33/0023* (2013.01); *G01R 33/007* (2013.01); *G01R 33/07* (2013.01); *G05F 1/569* (2013.01); *G05F 1/575* (2013.01); *G05F 1/595* (2013.01); *G05F 3/262* (2013.01)

(58) Field of Classification Search
CPC ... G01R 31/396; G01R 35/00; G01R 31/3835
See application file for complete search history.

(56) References Cited

U.S. PATENT DOCUMENTS

| | | | |
|---|---|---|---|
| 8,085,563 B2 * | 12/2011 | Gaboury | H02M 1/4225 323/222 |
| 9,588,541 B1 * | 3/2017 | Ho | G05F 3/267 |
| 2005/0200345 A1 * | 9/2005 | Chen | G05F 1/56 323/316 |

(Continued)

OTHER PUBLICATIONS

Datasheet of Allegro MicroSystems, LLC for A1346 "Dual-Die Programmable Linear Hall IC with Advanced Diagnostics for Safety-Critical Applications" Sep. 20, 2017; 48 pages.

*Primary Examiner* — Alvaro E Fortich
(74) *Attorney, Agent, or Firm* — Daly, Crowley, Mofford & Durkee, LLP (57) ABSTRACT

Apparatus including a regulator configured to generate a regulated output and a diagnostic circuit configured to generate a diagnostic signal indicative of whether the regulator is able to maintain regulation is described. The regulator includes an amplifier having a first input responsive to a reference voltage, a second input responsive to a feedback signal associated with the regulated output, and an output at which a control voltage is provided and further includes a pass element controlled by the control voltage and coupled to a node which the regulated output is provided. The diagnostic circuit is responsive to the control voltage and to the reference voltage to generate the diagnostic signal. The regulator may be a voltage regulator or a current regulator and in some embodiments, the diagnostic signal takes the form of a composite signal indicative of whether a voltage regulator and whether a current regulator can maintain regulation.

20 Claims, 4 Drawing Sheets

(56) References Cited

U.S. PATENT DOCUMENTS

| | | | |
|---|---|---|---|
| 2013/0176012 A1* | 7/2013 | Eagen | H03K 17/24 323/293 |
| 2013/0207625 A1* | 8/2013 | Futamura | G05F 1/10 323/271 |
| 2014/0015509 A1* | 1/2014 | Gupta | G05F 3/30 323/313 |
| 2016/0043539 A1* | 2/2016 | Mallala | G05F 1/569 361/18 |
| 2016/0252919 A1* | 9/2016 | Tanaka | G05F 1/575 323/280 |
| 2016/0344355 A1* | 11/2016 | Siniscalchi | H03F 3/45273 |
| 2017/0205841 A1* | 7/2017 | Jefremow | G05F 1/575 |
| 2017/0371365 A1* | 12/2017 | Kossel | G05F 1/575 |

* cited by examiner

CIRCUITS AND METHODS FOR REGULATOR DIAGNOSTICS

CROSS REFERENCE TO RELATED APPLICATIONS

Not Applicable.

STATEMENT REGARDING FEDERALLY SPONSORED RESEARCH

Not Applicable.

FIELD

This disclosure relates generally to diagnostic circuits and methods and, more particularly, to diagnostic circuits and methods for voltage and current regulators.

BACKGROUND

Regulators, or converters, including a switch for transferring energy from an input or supply power source, such as an AC or DC voltage or current source, to a regulated output are well known. An important specification of regulators is the desired average output level, which may be referred to as the regulation point. The regulation point is generally specified to have a permissible range to which the regulator will maintain the output over specified conditions, such as load and temperature conditions, as well as over process and circuit variations, such as offsets and gain errors. When the regulator is able to maintain the output within the permissible range, the regulator may be described as maintaining regulation; whereas, when conditions prevent the output from being maintained within the permissible range, the regulator may be described as being unable to maintain regulation.

Voltage and current regulators are used in a variety of sensor applications, including many safety critical applications, such as in automobiles. There are a variety of industry specifications that set forth requirements related to permissible sensor quality levels, failure rates, and overall functional safety. One such application is magnetic field sensors that include one or magnetic field sensing elements, such as a Hall effect element or a magnetoresistive element, to sense a magnetic field as may be associated with proximity or motion of a target object, such as a ferromagnetic object in the form of a gear or ring magnet, or to sense a current, as examples.

A typical regulator requirement is the detection of when the regulator begins to degrade as a result of reduced supply voltage. Such under voltage detection is often achieved with the use of a fixed threshold for comparison to the regulated output. Selection of the threshold requires careful consideration of process variables and can result in use of a threshold that is higher than the level where the regulator performance actually begins to degrade.

SUMMARY

Apparatus according to the disclosure includes a regulator supplied by a supply voltage and configured to generate a regulated output and a diagnostic circuit configured to generate a diagnostic signal indicative of whether the regulator is able to maintain regulation of the regulated output. In embodiments, the regulator includes an amplifier having a first input responsive to a reference voltage, a second input responsive to a feedback signal associated with the regulated output, and an output at which a control voltage is provided. The regulator also includes a pass element controlled by the control voltage and coupled to a node which the regulated output is provided. The diagnostic circuit is responsive to the control voltage and to the reference voltage.

With this arrangement, adaptive diagnostics are achieved in the sense that the detection is independent of the regulation point (i.e., the intended average output level) and thus, the diagnostic circuit does not require redesign to operate with a different regulated output levels. Furthermore, the described diagnostic signal generation permits regulator operation to continue until the regulator is no longer able to maintain regulation (rather than to some higher level as in the case of conventional under voltage detection based on a fixed comparison threshold). Additionally, the described diagnostic signal is indicative of a loss of regulation for reasons other than only a supply voltage that is too low.

In some embodiments, the regulator is a voltage regulator and the regulated output is a voltage. The voltage regulator may further include a current mirror having a first current path coupled to the pass element and a second current path coupled to the node at which the regulated voltage is provided. The diagnostic signal may be further indicative of one or both of the (a) supply voltage being below a voltage level sufficient for the regulator to maintain regulation or (b) a fault in the regulator.

In some embodiments, the regulator is a current regulator and the regulated output is a current. The current regulator may further include a current mirror having a first current path coupled to a current source and a second current path coupled to the pass element and to the node at which the regulated current is provided. A load coupled to receive the regulated current may include a magnetic field sensing element. The diagnostic signal may be further indicative of one or more of the following: (a) a temperature being high enough to increase a resistance of the magnetic field sensing element above a predetermined resistance; (b) the magnetic field sensing element not being connected; or (c) a supply voltage coupled to the current mirror being too low.

Also described is apparatus including a voltage regulator, which voltage regulator includes an amplifier having a first input coupled to receive a reference voltage, a second input coupled to receive a feedback signal, and an output configured to provide a node voltage and a current mirror coupled to the output of the amplifier and coupled to the second input of the amplifier, wherein the current mirror receives the node voltage from the amplifier and provides the feedback signal to the amplifier, wherein the current mirror is supplied by a supply voltage. The apparatus further includes a diagnostic circuit having a first input coupled to receive the reference voltage, a second input coupled to receive the node voltage and an output at which is provided a voltage regulator diagnostic signal indicative of whether or not the voltage regulator can maintain voltage regulation.

Features may include one or more of the following individually or in combination with other features. The current mirror may include a first resistor and a second resistor coupled in series, wherein the second resistor is coupled to ground and the feedback signal is supplied by a feedback node between the first resistor and the second resistor. The indication of whether or not the voltage regulator can maintain voltage regulation may include an indication of one or both of (a) whether or not the supply voltage is sufficient for the voltage regulator to maintain voltage regulation; or (b) whether or not the voltage regulator has experienced a fault. The indication of whether or not the voltage regulator can maintain voltage regulation may include an indication that the voltage regulator cannot maintain voltage regulation in response to the node voltage being below the reference voltage. The reference voltage may be associated with a bandgap voltage.

Also described is apparatus including a current regulator, which current regulator includes an amplifier having a first input coupled to receive a reference voltage, a second input coupled to receive a feedback signal and an output configured to provide a gate voltage and a current mirror coupled to the output of the amplifier and coupled to the second input of the amplifier, wherein the current mirror receives the gate voltage from the amplifier and provides the feedback signal to the amplifier, wherein a current mirrored by the current mirror is established by a current source. The apparatus also includes a diagnostic circuit having a first input coupled to receive the reference voltage, a second input coupled to receive the gate voltage and an output configured to provide a current regulator diagnostic signal indicative of whether or not the current regulator can maintain current regulation.

Features may include one or more of the following individually or in combination with other features. The apparatus may further include a magnetic field sensing element coupled to the current mirror to receive the mirrored current, wherein the current regulator diagnostic signal includes an indication of a temperature being high enough to increase a resistance of the magnetic field sensing element above a predetermined resistance. The current regulator diagnostic signal may include an indication of whether or not the magnetic field sensing element is connected. The current regulator diagnostic signal may include an indication of whether or not a supply voltage coupled to the current mirror is too low. The apparatus may further include an OR gate having a first input coupled to receive a voltage regulator diagnostic signal, a second input coupled to receive the current regulator diagnostic signal, and an output at which a composite diagnostic signal is provided. The voltage regulator diagnostic signal may be indicative of whether or not a voltage regulator has a supply voltage that is sufficient to allow the voltage regulator to maintain voltage regulation.

According to a further aspect, apparatus includes a regulator configured to generate a regulated output and means for comparing voltages to provide a diagnostic signal indicative of whether or not the regulator is able to maintain regulation of the regulated output, wherein the voltage comparing means is configured to compare a control voltage to a reference voltage. The regulator may include means for generating a difference signal having a first input coupled to receive the reference voltage, a second input coupled to receive a feedback signal associated with the regulated output, and an output at which the control voltage is provided and means, responsive to the control voltage, for generating the regulated output.

Features may include one or more of the following individually or in combination with other features. In some embodiments, the regulator may be a voltage regulator, wherein the means for generating the regulated output is responsive to a supply voltage, and wherein the diagnostic signal is indicative of whether the supply voltage is too low to permit the voltage regulator to maintain regulation. In other embodiments, the regulator may be a current regulator.

BRIEF DESCRIPTION OF THE DRAWINGS

The foregoing features of the disclosure, as well as the disclosure itself may be more fully understood from the following detailed description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

Figure 1:
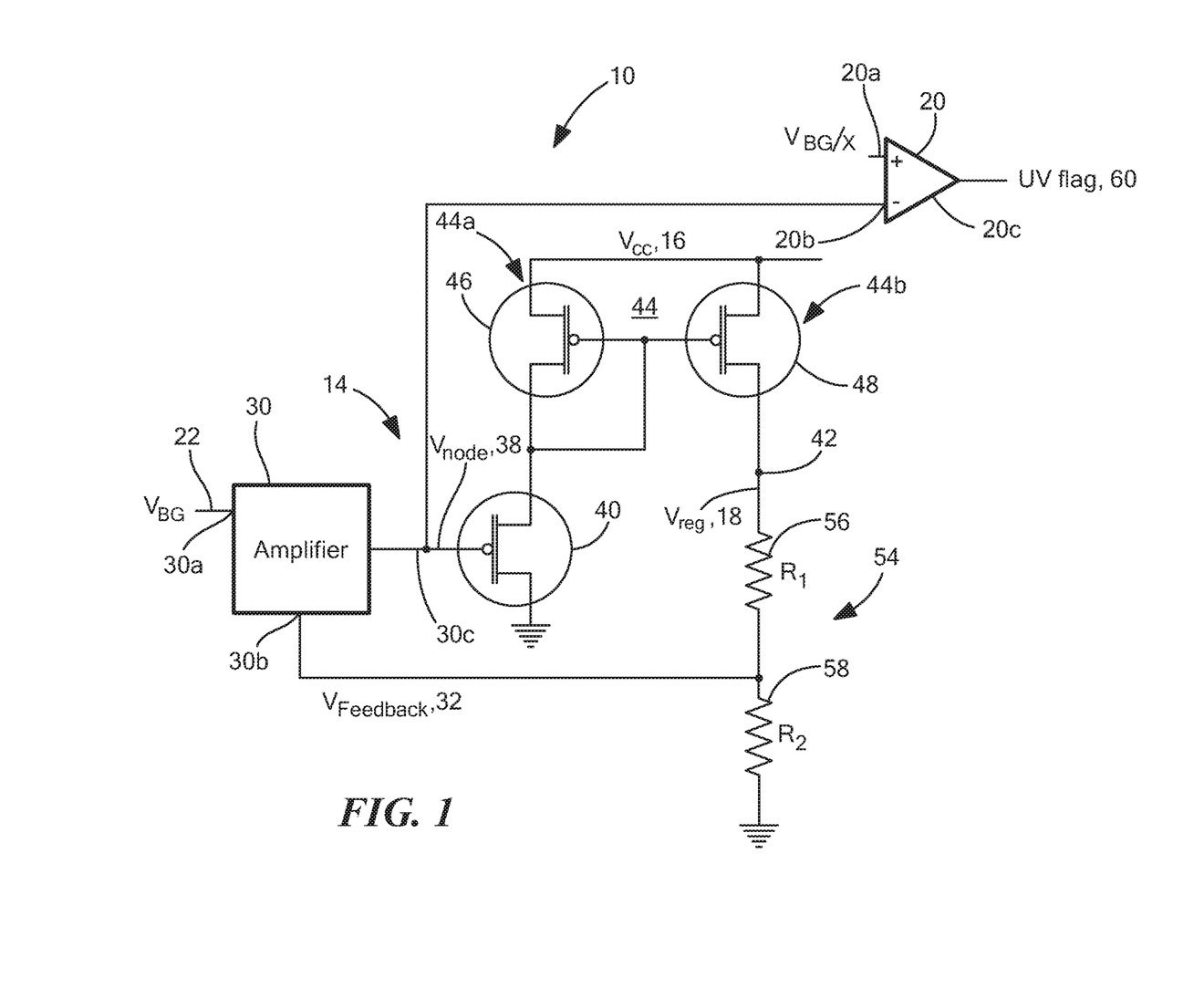
FIG. 1 is a block diagram of apparatus including a voltage regulator and a diagnostic circuit.

Referring to FIG. 1, apparatus 10 includes a regulator 14 configured to generate a regulated output Vreg 18 and a diagnostic circuit 20 configured to generate a diagnostic signal 60 indicative of whether the regulator is able to maintain regulation of the regulated output. In embodiments, the regulator 14 includes an amplifier 30 having a first input 30a responsive to a reference voltage $V_{BG}$ 22, a second input 30b responsive to a feedback signal $V_{Feedback}$ 32 associated with the regulated output, and an output 30c at which a control voltage Vnode 38 (which may be referred to alternatively as a node voltage) is provided. The regulator 14 also includes a pass element 40 (or more generally a switch 40) controlled by the control voltage 38 and coupled to a node 42 which the regulated output 18 is provided to a load (not shown).

Figure 4:
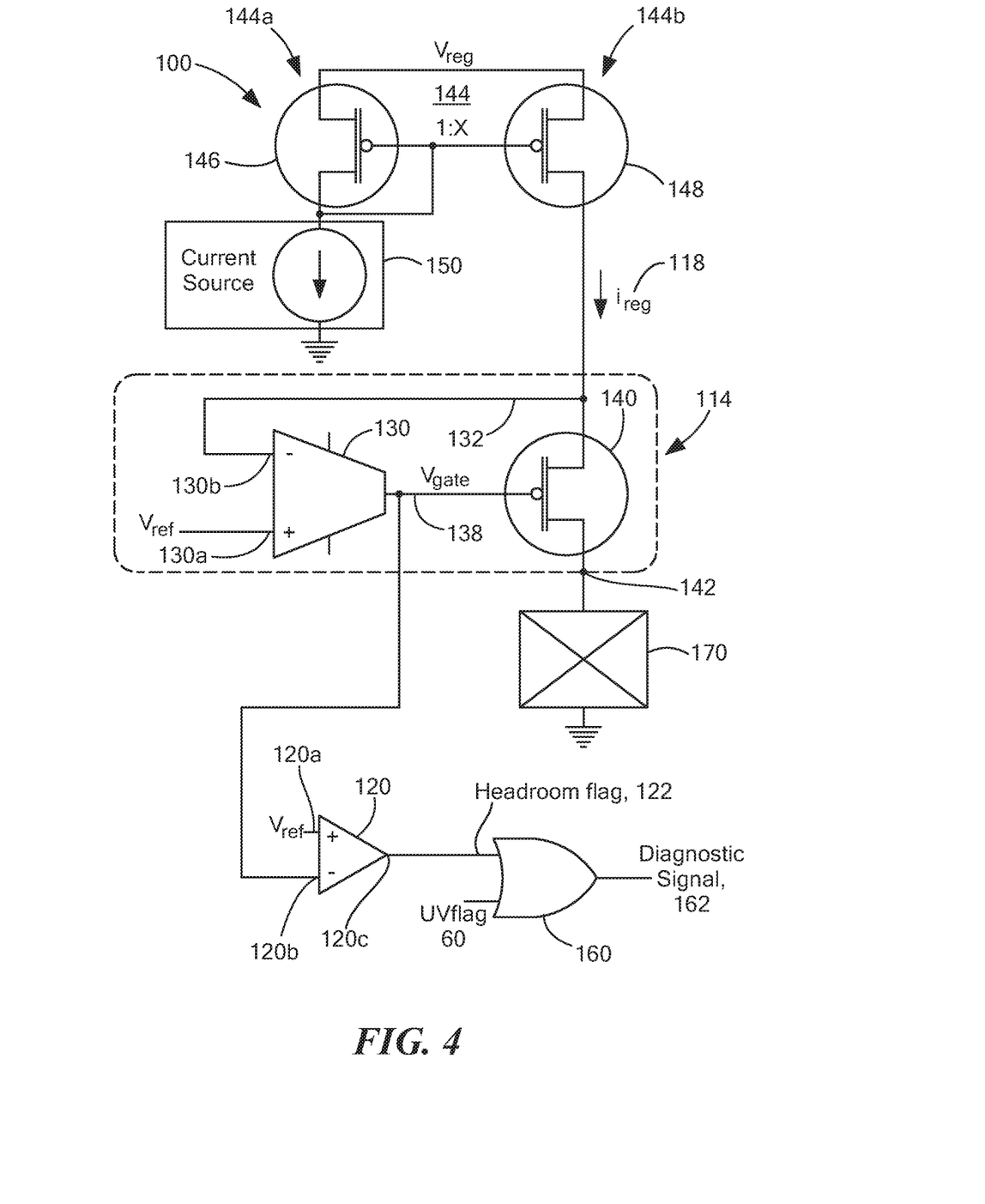
FIG. 4 is a block diagram of apparatus including a current regulator and a diagnostic circuit.

In some embodiments, the regulated output 18 is a regulated voltage Vreg and in other embodiments, the regulator output is a regulated current (e.g., FIG. 4). The pass element 40 may be coupled to the regulator output node 42 through a current mirror 44 supplied by a supply voltage $V_{CC}$ 16 and having a first current path 44a coupled to the pass element 40 and a second current path 44b coupled to the node 42 at which the regulated voltage 18 is provided. More particularly, the first current path 44a may include a first Metal Oxide Semiconductor (MOS) transistor, such as the illustrated PMOS Field Effect Transistor (FET) 46, and the second current path 44b may include a second MOS transistor, such as the illustrated PMOS FET 48. The pass element 40 may also take the form of a PMOS FET including a gate terminal coupled to the node voltage 38, a source terminal coupled to current mirror FET 46, and a drain terminal coupled to ground, as shown.

A resistor divider 54 coupled to the regulator output node 42 includes a first resistor 56 coupled in series with a second resistor 58. The feedback signal 32 is provided at a node between the first and second resistors 56, 58 as a divided version of the regulated voltage Vreg 18. The reference voltage $V_{BG}$ 22 may be provided by a bandgap reference and in one example embodiment has a level of 1.2 volts. It will be appreciated that other voltage regulator elements and topologies are possible.

In embodiments, the diagnostic circuit 20 may take the form of a comparator having a first input 20a (e.g., a non-inverting input) responsive to the reference voltage (i.e., as may take the form of a divided version $V_{BG}/x$ of the reference voltage $V_{BG}$), a second input 20b (e.g., an inverting input) responsive to node voltage 38, and an output 20c at which the diagnostic signal 60 is provided. The diagnostic signal 60 may be referred to alternatively as an under voltage or UV flag and in some embodiments, may be indicative of one or both of the (a) supply voltage $V_{CC}$ 16 being below a voltage level sufficient for the regulator to maintain regulation or (b) a fault within the regulator 14. The diagnostic signal 60 may be coupled to circuits and systems (not shown) in order to put the load system relying on the regulator 14 for power into a known or safe state.

Figure 2:
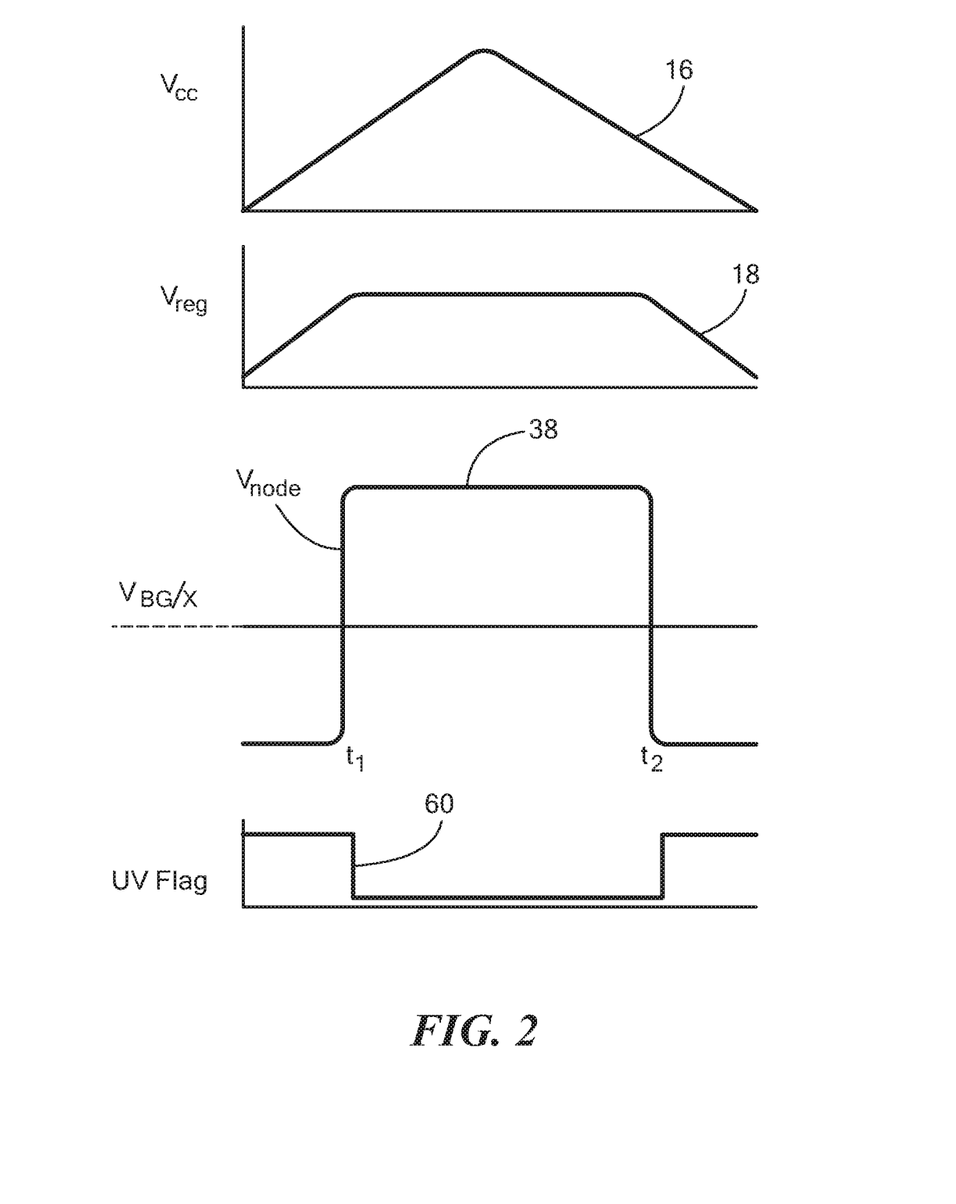
FIG. 2 shows several waveforms associated with the apparatus of FIG. 1.

Referring also to FIG. 2, several example waveforms associated with the apparatus of FIG. 1 are shown, including the supply voltage $V_{CC}$ 16, the regulated voltage Vreg 18, the divided reference voltage $V_{BG}/x$, the node voltage 38, and the UV flag 60. In steady state operation, once the supply voltage $V_{CC}$ 16 is sufficiently high, voltages within the amplifier 30 reach a steady state condition and the amplifier inputs 30a and 30b are substantially equal. If the regulated voltage Vreg 18 drops, the feedback signal 32 also drops, causing the negative feedback of the amplifier 30 to compensate by increasing conduction of transistor 40 which thereby increases the current through the current mirror 44 and forces more current into the resistor divider 54 to bring the feedback signal 32 up to the level of the reference voltage $V_{BG}$ 22. Conversely, if the regulated voltage Vreg 18 increases, the feedback signal 32 also increases, causing the amplifier 30 to compensate by decreasing conduction of the transistor 40 which thereby decreases current through the current mirror 44 and decreases the current into the resistor divider 54 to bring the feedback signal 32 down to the level of the reference voltage $V_{BG}$ 22.

If conditions occur that prevent the regulator 14 from maintaining the regulated output voltage Vreg 18 within regulation (e.g., either because the supply voltage $V_{CC}$ 16 falls below a level sufficient for the regulator to maintain regulation or because an error condition or failure occurs within the regulator circuitry), the output 30c of the amplifier (i.e., the node voltage 38) experiences a large, fast change (e.g., decrease) in voltage. This change in the node voltage 38 (e.g., the large decrease in the node voltage at time t2) is detected by the comparator 20 (i.e., as the node voltage 38 crosses the reference voltage $V_{BG}/x$) and causes the output of the comparator (i.e., the UV flag 60) to transition in order to thereby indicate an inability of the regulator 14 to maintain regulation.

More particularly, at power up, before the supply voltage $V_{CC}$ 16 is high enough for the regulator 14 to provide the regulated output voltage Vreg 18 within regulation limits, the node voltage 38 is less than the divided reference voltage $V_{BG}/x$ and the UV flag 60 at the comparator output 20c is high, in order to thereby indicate that the output voltage Vreg 18 is not within regulation. Thereafter, at a time t1, when the supply voltage 16 reaches a level necessary to provide voltage regulation, the node voltage 38 crosses the divided reference voltage $V_{BG}/x$ and the UV flag 60 transitions to a low level, in order to thereby indicate that the output voltage Vreg 18 is within regulation. Thereafter, if the regulator 14 is unable to maintain the regulated output voltage Vreg 18 within regulation (e.g., as is shown to occur at time t2 due to a falling supply voltage $V_{CC}$ 16), the output 30c of the amplifier (i.e., the node voltage 38) experiences a large, fast change (e.g., decrease) in voltage which cause the comparator output 20c to transition to a high level, in order to thereby indicate that the output voltage Vreg 18 is not within regulation. While in the illustrated example, the UV flag 60 is active high such that a low to high transition at time t2 is indicative of a loss of regulation, it will be appreciated that the UV flag 60 may alternatively be active low.

Significantly, it will be appreciated that although the loss of regulation at time t2 is shown to be due to a falling supply voltage $V_{CC}$ 16, the loss of regulation could alternatively be caused by a fault condition within the regulator. In other words, the supply voltage $V_{CC}$ 16 could remain above a level sufficient for the regulator 14 to provide the regulated output Vreg 18, but the regulated output Vreg 18 could fall out of regulation for other reasons that are detectable by the diagnostic circuit 20. Thus, the diagnostic signal 60 is indicative generally of the regulator 14 not being able to maintain regulation of the regulated output Vreg 18 and more specifically, may be indicative of one or both of the (a) supply voltage $V_{CC}$ 16 being below a voltage level sufficient for the regulator to maintain voltage regulation or (b) a fault within the regulator 14.

With this arrangement, adaptive under voltage detection is achieved in the sense that the detection is independent of the regulation point (i.e., the intended average output voltage level 18). Thus, the diagnostic circuit does not require redesign to operate with a different regulated output voltage level 18. Furthermore, the described diagnostic signal generation permits operation of the regulator 14 to the point where the regulator is no longer able to maintain regulation (rather than to some higher level as in the case of conventional under voltage detection based on a fixed comparison threshold). In this way, a wider supply voltage operating range is achieved. Additionally, the described diagnostic signal is indicative of a loss of regulation for reasons other than only a supply voltage that is too low.

Figure 3:
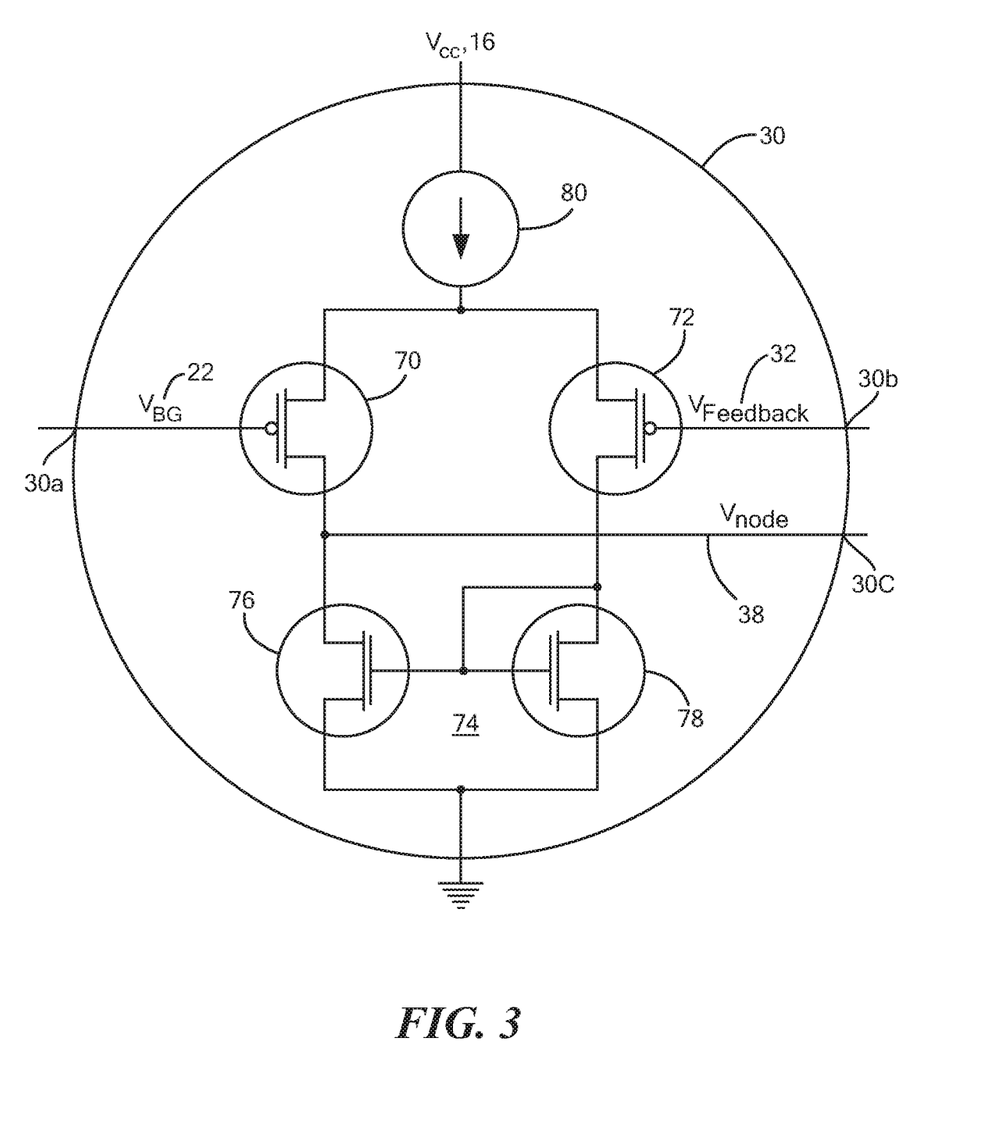
FIG. 3 is a schematic of an example amplifier for use in the apparatus of FIG. 1.

Referring also to FIG. 3, an example amplifier 30 includes a pair of matched PMOS FETs 70, 72, one of which 70 has a gate terminal at the first amplifier input 30a and responsive to reference voltage $V_{BG}$ 22 and one of which 72 has a gate terminal at the second amplifier input 30b and responsive to feedback signal 32 associated with the regulated output. The drain terminals of the FETs 70, 72 are commonly coupled to a current mirror 74 including FETs 76, 78, coupled as shown. The drain terminal of FET 70 is further coupled to output 30c of the amplifier at which the control voltage, or node voltage Vnode 38 is provided. The source terminals of FETs 70, 72 are commonly coupled to a current source 80. In operation, the amplifier generates node voltage Vnode 38 at a level necessary to keep the input voltages $V_{BG}$ 22 and $V_{Feedback}$ 32 substantially equal. It will be appreciated by those of ordinary skill in the art that other amplifier configurations are possible.

Referring also to FIG. 4, apparatus 100 includes a regulator 114 as may take the form of a current regulator configured to generate a regulated output 118 in the form of a regulated current Ireg and a diagnostic circuit 120 configured to generate a diagnostic signal 122 indicative of whether or not the regulator 114 is able to maintain regulation of the regulated output.

In embodiments, the regulator 114 includes an amplifier 130 having a first input 130a responsive to a reference voltage Vref, a second input 130b responsive to a feedback signal 132 associated with the regulated output, and an output 130c at which a control voltage 138 (which may be referred to alternatively as a gate voltage 138) is provided. The regulator 114 also includes a pass element 140 controlled by the control voltage 138 and coupled to a node 142 which the regulated output 118 is provided to a load 170.

In some embodiments, the regulator 114 may further include a current mirror 144 having a first current path 144a coupled to a current source 150 and a second current path 144b coupled to the pass element 140. More particularly, the first current path 144a may include a first PMOS FET 146 and the second current path 144*b* may include a second PMOS FET 148. The commonly connected source terminals of the current mirror FETs 146, 148 are coupled to a regulated voltage, such as the Vreg voltage (which may be the same as or similar to the regulated output voltage Vreg 18 of FIG. 1). The pass element 140 may also take the form of a PMOS FET having a gate terminal coupled to the output of the amplifier 130 to receive the gate voltage 138, a source terminal coupled to the current mirror FET 148, and a drain terminal coupled to the load 170.

An example load 170 shown in FIG. 4 takes the form of one or more Hall effect elements. Thus, in this application, the current regulator 114, current source 150, and current mirror 144 may be referred to as a Hall driver. In operation, the current source 150 provides a current level selected to supply the Hall effect element 170 with a desired drive current to obtain a predetermined transducer sensitivity. If the current level established by the current source 150 and mirrored by current mirror 144 (i.e., ireg 118) becomes insufficient to drive the Hall effect element, then the Hall effect element will not operate properly with the desired sensitivity. If the regulator 114 becomes unable to maintain the required drive current (i.e., unable to maintain regulation of the regulated output 118), then the PMOS FET 148 will saturate and the feedback signal 132 will increase. An increasing feedback signal 132 will cause the gate voltage 138 to experience and abrupt and large voltage swing.

Various conditions can result in the current regulator 114 being unable to maintain regulation of the current ireg 118. For example, when operating temperatures increase beyond a specified level, the resistance of the Hall effect element 170 can increase requiring more drive current than the regulator 114 can supply. Additionally, the current mirror 144 may not be able to provide the desired regulated current ireg 118 if the Hall effect element 170 (or other load) is not connected to regulator node 142 or if the supply voltage Vreg becomes too low.

The diagnostic circuit 120 may take the form of a comparator having a first input 120*a* (e.g., a non-inverting input) responsive to the reference voltage Vref, a second input 120*b* (e.g., an inverting input) responsive to gate voltage 138, and an output 120*c* at which a diagnostic signal 122 is provided. The diagnostic signal 122 may be referred to alternatively as headroom signal or flag and in some embodiments, is indicative of the regulator 114 not being able to maintain regulation of the regulated current ireg 118. More specifically, the diagnostic signal 122 may be indicative of one or more of the following: (a) a temperature being high enough to increase a resistance of the magnetic field sensing element 170 above a predetermined resistance; (b) the load 170 (i.e., magnetic field sensing element) not being connected; or (c) a supply voltage coupled to the current mirror (i.e., Vreg) being too low.

With this arrangement, an adaptive current regulator 114 is provided with a diagnostic signal in the form of the headroom flag 122 in the sense that instead of designing the regulated current level ireg to accommodate worst case conditions and scenarios (e.g., an increase in load resistance as may result from elevated temperatures, a load disconnection, or a current mirror supply voltage that is too low), the headroom flag 122 is used to alert the system to an inability to supply the drive current to the load so that appropriate action can be taken.

Diagnostic circuitry may additionally include circuitry, such as the illustrated OR gate 160, configured to generate a composite diagnostic signal 162 in response to the headroom flag 122 and to the UV flag 60 (FIG. 1). The composite diagnostic signal 162 (either alone or in addition to one or both of the UV flag 60 and/or the headroom flag 122) may be coupled to circuits and systems (not shown) in order to put the load system relying on the regulator 114 for power into a known or safe state. It will be appreciated that, while providing each of the headroom flag 122 and the UV flag 60 to a system controller advantageously allows for the cause of the loss of regulation to be determined, one or two additional connections/pins are required beyond simply providing the composite diagnostic signal 162.

While a Hall effect element is described as the example load 170 to the current regulator 114 of FIG. 4, any type of regulator application will benefit from use of the described circuits and techniques. Furthermore, in embodiments the load may include other types of magnetic field sensing elements, such as, but not limited to a magnetoresistance element or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR, including spin-valve structures) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

All references cited herein are hereby incorporated herein by reference in their entirety.

Having described preferred embodiments, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. Apparatus comprising:
   a regulator supplied by a supply voltage and configured to generate a regulated output, the regulator comprising:
   an amplifier having a first input responsive to a reference voltage, a second input responsive to a feedback signal indicative of a level the regulated output, and an output at which a control voltage is provided;
   a pass element having a first terminal coupled to receive the control voltage to control conduction of the pass element and having second terminal; and
   a current mirror coupled to the second terminal of the pass element and having a path at which the regulated output and the feedback signal are provided, wherein the amplifier compensates the current mirror by increasing a current through the current mirror if the feedback signal indicates a decrease in an amplitude of the regulated output, and the amplifier further compensates the current mirror by decreasing the current through the current mirror if the feedback signal indicates an increase in the amplitude of the regulated output; and a diagnostic circuit responsive to the control voltage and to the reference voltage and configured to generate a diagnostic signal indicative of whether the regulator is able to maintain regulation of the regulated output, wherein the control voltage experiences a change detected by the diagnostic circuit when the regulator is not able to maintain regulation of the regulated output.

2. The apparatus of claim 1, wherein the regulated output is a regulated voltage.

3. The apparatus of claim 2, wherein the current mirror comprises a first current path coupled to the second terminal of the pass element and a second current path at which the regulated output and the feedback signal are provided.

4. The apparatus of claim 2, wherein the diagnostic signal is further indicative of one or both of the (a) supply voltage being below a voltage level sufficient for the regulator to maintain regulation or (b) a fault in the regulator.

5. The apparatus of claim 1, wherein the regulated output is a regulated current.

6. The apparatus of claim 5, wherein the current mirror comprises a first current path coupled to a current source and a second current path coupled to the second terminal of the pass element and at which the regulated output and the feedback signal are provided.

7. The apparatus of claim 6, further comprising a load coupled to receive the regulated current.

8. The apparatus of claim 7, wherein the load comprises a magnetic field sensing element.

9. The apparatus of claim 8, wherein the diagnostic signal is further indicative of one or more of the following: (a) a temperature being high enough to increase a resistance of the magnetic field sensing element above a predetermined resistance; (b) the magnetic field sensing element is not connected; or (c) a supply voltage coupled to the current mirror is too low.

10. Apparatus comprising:
a voltage regulator comprising:
an amplifier having a first input coupled to receive a reference voltage, a second input coupled to receive a feedback signal and an output configured to provide a control voltage;
a pass element having a first terminal coupled to receive the control voltage to control conduction of the pass element and having a second terminal; and
a current mirror having a first path coupled to the second terminal of the pass element and having a second path at which a regulated output voltage and the feedback signal are provided, wherein the amplifier compensates the current mirror by increasing a current through the current mirror if the feedback signal indicates a decrease in an amplitude of the regulated output voltage, and the amplifier further compensates the current mirror by decreasing the current through the current mirror if the feedback signal indicates an increase in the amplitude of the regulated output voltage; and
a diagnostic circuit having a first input coupled to receive the reference voltage, a second input coupled to receive the control voltage and an output at which is provided a voltage regulator diagnostic signal indicative of whether or not the voltage regulator can maintain voltage regulation, wherein the control voltage experiences a change detected by the diagnostic circuit when the voltage regulator is not able to maintain regulation of the regulated output voltage.

11. The apparatus of claim 10, wherein the voltage regulator further comprises a first resistor and a second resistor coupled in series, wherein the second resistor is coupled to ground and the feedback signal is supplied by a feedback node between the first resistor and the second resistor.

12. The apparatus of claim 10, wherein the indication of whether or not the voltage regulator can maintain voltage regulation comprises an indication of one or both of (a) whether or not a supply voltage is sufficient for the voltage regulator to maintain voltage regulation; or (b) whether or not the voltage regulator has experienced a fault.

13. The apparatus of claim 10, wherein the indication of whether or not the voltage regulator can maintain voltage regulation comprises an indication that the voltage regulator cannot maintain voltage regulation in response to the control voltage being below the reference voltage.

14. The apparatus of claim 10, wherein the reference voltage is a bandgap voltage.

15. Apparatus comprising:
a current regulator comprising:
an amplifier having a first input coupled to receive a reference voltage, a second input coupled to receive a feedback signal and an output configured to provide a gate voltage;
a pass element having a first terminal coupled to receive the gate voltage and having a second terminal; and
a current mirror having a first path coupled to a current source and having a second path at which a regulated output current and the feedback signal are provided, wherein a current mirrored by the current mirror is established by the current source and wherein the amplifier compensates the current mirror by increasing a current through the current mirror if the feedback signal indicates a decrease in an amplitude of the regulated output current and the amplifier further compensates the current mirror by decreasing the current through the current mirror if the feedback signal indicates an increase in the amplitude of the regulated output current; and
a diagnostic circuit having a first input coupled to receive the reference voltage, a second input coupled to receive the gate voltage and an output configured to provide a current regulator diagnostic signal indicative of whether or not the current regulator can maintain current regulation, wherein the gate voltage experiences a change detected by the diagnostic circuit when the current regulator is not able to maintain regulation of the regulated output current.

16. The apparatus of claim 15, further comprising a magnetic field sensing element coupled to the current mirror to receive the mirrored current, wherein the current regulator diagnostic signal comprises an indication of a temperature being high enough to increase a resistance of the magnetic field sensing element above a predetermined resistance.

17. The apparatus of claim 16, wherein the current regulator diagnostic signal comprises an indication of whether or not the magnetic field sensing element is connected.

18. The apparatus of claim 15, wherein the current regulator diagnostic signal comprises an indication of whether or not a supply voltage coupled to the current mirror is too low.

19. The apparatus of claim 15, further comprising an OR gate having a first input coupled to receive a voltage regulator diagnostic signal, a second input coupled to receive the current regulator diagnostic signal and an output at which a composite diagnostic signal is provided.

20. The apparatus of claim 19, wherein the voltage regulator diagnostic signal is indicative of whether or not a voltage regulator has a supply voltage that is sufficient to allow the voltage regulator to maintain voltage regulation.

* * * * *

UNITED STATES PATENT AND TRADEMARK OFFICE
CERTIFICATE OF CORRECTION

PATENT NO. : 10,634,735 B2  
APPLICATION NO. : 15/830107  
DATED : April 28, 2020  
INVENTOR(S) : Vladimir Kravljaca et al.

Page 1 of 1

It is certified that error appears in the above-identified patent and that said Letters Patent is hereby corrected as shown below:

On the Title Page (72) Inventors: delete "Manchester, NH" and replace with --Portland, ME--.

In the Specification

Column 1, Line 25 delete "arc well" and replace with --are well--.

Column 1, Line 44 delete "one or magnetic" and replace with --one or more magnetic--.

Column 2, Line 11 delete "with a different" and replace with --with different--.

Column 5, Line 61 delete "which cause" and replace with --which causes--.

Column 7, Line 27 delete "and abrupt" and replace with --an abrupt--.

Signed and Sealed this  
Twentieth Day of October, 2020

Andrei Iancu  
*Director of the United States Patent and Trademark Office*